(12) United States Patent
Park et al.

(10) Patent No.: US 11,678,452 B2
(45) Date of Patent: *Jun. 13, 2023

(54) FLEXIBLE COVER WINDOW HAVING IMPROVED VISIBILITY

(71) Applicant: UTI INC., Chungcheongnam-do (KR)

(72) Inventors: Deok Young Park, Gyeonggi-do (KR); Jae Young Hwang, Gyeonggi-do (KR); Hak Chul Kim, Chungcheongnam-do (KR); Kukhyun Sunwoo, Gyeonggi-do (KR); Tea Joo Ha, Chungcheongnam-do (KR)

(73) Assignee: UTI INC.

( * ) Notice: Subject to any disclaimer, the term of this patent is extended or adjusted under 35 U.S.C. 154(b) by 255 days.

This patent is subject to a terminal disclaimer.

(21) Appl. No.: 16/844,630

(22) Filed: Apr. 9, 2020

(65) Prior Publication Data

US 2020/0329575 A1 Oct. 15, 2020

(30) Foreign Application Priority Data

Apr. 15, 2019 (KR) .................. 10-2019-0043940

(51) Int. Cl.

| | |
|---|---|
| *H05K 5/03* | (2006.01) |
| *H04M 1/02* | (2006.01) |
| *B32B 3/26* | (2006.01) |
| *B32B 3/30* | (2006.01) |
| *G09F 9/30* | (2006.01) |
| *G02F 1/1333* | (2006.01) |
| *G02B 1/14* | (2015.01) |
| *H05K 5/00* | (2006.01) |

(52) U.S. Cl.
CPC .............. *H05K 5/03* (2013.01); *G02B 1/14* (2015.01); *H05K 5/0017* (2013.01)

(58) Field of Classification Search
CPC ... H04M 1/0268; H01L 51/0097; H05K 5/08; G06G 1/1652; G09F 9/301; B32B 3/26; B32B 3/263; B32B 3/30; G06F 2203/04102; G06F 1/1641; G02F 1/133305
See application file for complete search history.

(56) References Cited

U.S. PATENT DOCUMENTS

| | | | |
|---|---|---|---|
| 2012/0320509 A1* | 12/2012 | Kim ...................... | B32B 17/10 361/679.01 |
| 2018/0132371 A1* | 5/2018 | Yeum ................... | H05K 5/0017 |
| 2018/0217639 A1 | 8/2018 | Jones et al. | |
| 2018/0219162 A1* | 8/2018 | Tang .................... | H01L 27/3246 |

FOREIGN PATENT DOCUMENTS

| | | |
|---|---|---|
| KR | 1020160083789 A | 7/2016 |
| KR | 1020170122554 A | 11/2017 |
| KR | 1020190022934 A | 3/2019 |

* cited by examiner

*Primary Examiner* — Joanna Pleszczynska
(74) *Attorney, Agent, or Firm* — Mendelsohn Dunleavy, P.C.

(57) ABSTRACT

A cover window is provided, and more particularly, a flexible glass-based cover window for a flexible display is provided, the cover window including: a folding part slimmed by corresponding to a folding area of the display, and a boundary part provided on opposite ends of the folding part, the boundary part having a thickness gradually becoming larger from the folding part and continuing to a plane area of the cover window, wherein inclination of the boundary part is 1 to 10° relative to the folding part.

6 Claims, 8 Drawing Sheets

| Angle (degree) | tan(x)= Inclination | x (micron) | y (micron) | X-axis during 17.5μm etching | X-axis during 35μm etching |
|---|---|---|---|---|---|
| 45 | 1.000 | 100 | 100.000 | 17.5 | 35 |
| ... | ... | ... | ... | | |
| 30 | 0.577 | 100 | 57.735 | 30.311 | 60.622 |
| 18 | 0.325 | 100 | 32.492 | 53.859 | 107.719 |
| 17 | 0.306 | 100 | 30.573 | 57.240 | 114.480 |
| 16 | 0.287 | 100 | 28.675 | 61.030 | 122.060 |
| 15 | 0.268 | 100 | 26.795 | 65.311 | 130.622 |
| 14 | 0.249 | 100 | 24.933 | 70.189 | 140.377 |
| 13 | 0.231 | 100 | 23.087 | 75.801 | 151.602 |
| 12 | 0.213 | 100 | 21.256 | 82.331 | 164.662 |
| 11 | 0.194 | 100 | 19.438 | 90.030 | 180.059 |
| 10 | 0.176 | 100 | 17.633 | 99.247 | 198.495 |
| 9 | 0.158 | 100 | 15.838 | 110.491 | 220.981 |
| 8 | 0.141 | 100 | 14.054 | 124.519 | 249.038 |
| 7 | 0.123 | 100 | 12.278 | 142.526 | 285.052 |
| 6 | 0.105 | 100 | 10.510 | 166.501 | 333.003 |
| 5 | 0.087 | 100 | 8.749 | 200.026 | 400.052 |
| 4 | 0.070 | 100 | 6.993 | 250.262 | 500.523 |
| 3 | 0.052 | 100 | 5.241 | 333.920 | 667.840 |
| 2 | 0.035 | 100 | 3.492 | 501.134 | 1002.269 |
| 1 | 0.017 | 100 | 1.746 | 1002.574 | 2005.149 |

FLEXIBLE COVER WINDOW HAVING IMPROVED VISIBILITY

CROSS REFERENCE TO RELATED APPLICATION

The present application claims priority to Korean Patent Application No. 10-2019-0043940, filed Apr. 15, 2019, the entire contents of which is incorporated herein for all purposes by this reference.

BACKGROUND OF THE INVENTION

Field of the Invention

The present invention generally relates to a glass-based cover window. More particularly, the present invention relates to a flexible cover window, in which visibility is improved, and strength and folding properties are secured while the intrinsic texture of glass is maintained.

Description of the Related Art

Recently, electric and electronic technologies have been rapidly developed, and various types of display products are released to meet demands of a new era and various consumer demands. Among them, research on a flexible display in which the screen can be folded and unfolded is active.

The research on the flexible display is being conducted by bending, rolling, and stretching the display, fundamentally starting from folding the display. In addition to a display panel, a cover window protecting the display panel is also required to be formed flexibly.

Such a flexible cover window is required to fundamentally have excellent flexibility, and to have no marks on a folding part and no distortion of image quality even after being repeatedly folded.

The cover window of a conventional flexible display has used a polymer film such as a PI or PET film on a display panel surface.

However, since such a polymer film is weak in mechanical strength, the polymer film serves only to prevent scratches of the display panel and is vulnerable to external impacts. Furthermore, the polymer film has a low transmittance and is known to be relatively expensive.

In addition, in the case of the polymer film, as the number of times the display is folded increases, marks remain on the folding part, which inevitably damages the folding part. For example, the polymer film is pressed or torn during folding limit evaluation (usually 200,000 times).

Recently, a research on a glass-based cover window has been conducted to overcome the limitation of the cover window provided with the polymer film.

As a prior art for such a glass-based cover window, there is "Foldable display device" (Korean Patent Application Publication No. 10-2017-0122554), which provides a cover window formed to be thin in a folding part.

The thickness of the cover window according to the prior art is formed to become thicker as distance from a folding line defined as having the minimum thickness increases. That is, the folding part of the cover window according to the prior art in which a minimum thickness area is defined as a line shows a curved shape.

As for the prior art, the minimum thickness area of the folding part appears as a relatively small line (the folding line). In this case, when folding is repeated, thick parts break during the folding.

As for the folding part having a curved shape, it is not easy to align its center during mechanical assembly, so assembly tolerances may occur, which may result in deterioration of product quality and quality difference between products.

As for the prior art, the folding part having the thin portion formed in the cover window is bonded to the display panel, which is a flat plate. In this case, space (an air layer) is formed between the folding part and the surface of the display panel, which causes the problem of distortion of image quality due to difference in a refractive index between glass and the air layer. Furthermore, the folding part is damaged due to the pressure of a touch pen or is lowered in durability since a bonding force between portions adjacent to the folding part and the display panel is decreased.

Accordingly, the glass-based cover window is required to satisfy the folding properties and fundamentally required properties such as no distortion of image quality and sufficient strength to withstand the repeated touching and certain pressure of a touch pen. To satisfy the strength property of the cover window, the glass is required to have at least a predetermined thickness, and to satisfy the folding properties, the glass is required to have a predetermined thickness or less. Accordingly, research on the thickness and structure of an optimum cover window, which satisfies the folding properties while satisfying the strength property and has no distortion of image quality, is needed.

Furthermore, when glass has a predetermined thickness or less, intrinsic texture of tempered glass decreases, so this is also required to be taken into account.

Accordingly, a technique for providing the cover window is needed, in which appropriate thickness is maintained to secure strength while maintaining the intrinsic texture of tempered glass and the folding properties are also satisfied.

Due to such a need, the present applicant has filed a "Flexible cover window" (Korean Patent Application No. 10-2019-0027399).

The prior art provides a glass-based cover window for a flexible display, and includes a folding part slimmed by corresponding to a folding area of the display. Here, as illustrated in FIG. 1, a boundary part is formed on opposite ends of the folding part, the boundary part having a thickness gradually becoming larger from the folding part and continuing to a plane area of the cover window. The boundary part is visible to naked eye due to the reflection of light. Accordingly, visibility of the cover window may decrease.

FIG. 2 illustrates a case in which a reflective surface of the boundary part between the folding part and the plane area is visible to naked eye, which causes distortion of a screen and reduces resolution of a screen. This problem is required to be improved when the flexible cover window is applied.

SUMMARY OF THE INVENTION

Accordingly, the present invention has been made keeping in mind the above problems occurring in the related art, and the present invention is intended to propose a flexible cover window in which visibility is improved, and strength and folding properties are secured while the intrinsic texture of glass is maintained.

In order to achieve the above objective, according to one aspect of the present invention, there is provided a flexible glass-based cover window for a flexible display, the cover window including: a folding part slimmed by corresponding to a folding area of the display, and a boundary part provided on opposite ends of the folding part, the boundary part having a thickness gradually becoming larger from the folding part and continuing to a plane area of the cover window, wherein inclination of the boundary part is 1 to 10° relative to the folding part.

Furthermore, the inclination of the boundary part may be determined according to a thickness ($t_1$) of the folding part and a width (a) of the boundary part.

In addition, a thickness ($t_2$) of the cover window may be 50~300 μm and a thickness ($t_1$) of the folding part may be 20 to 100 μm.

In addition, the folding part may be provided on a surface or opposite surfaces of the cover window, and when the folding part is provided on the opposite surfaces of the cover window, depths of the folding parts may be configured to be the same or different.

Here, the folding part of the back surface of the cover window may be configured to be deeper.

Furthermore, the folding part may be provided to be uniform in the thickness in a folding area of the cover window. Additionally, the boundary part may be provided on the opposite ends of the folding part, the boundary part having the thickness gradually becoming larger from the folding part and continuing to the plane area of the cover window.

Here, the slimming of the folding part may be performed by any one process of wet etching, polishing, laser forming, and masking processes, or by a process of combining at least two processes thereof, or by the wet etching, the laser forming, or the masking process, which is followed by the polishing process.

In addition, the cover window may satisfy a minimum curvature radius of 0.5 to 2.5 mm during folding.

Furthermore, a width ($W_1$) of the folding part may be 3.0 to 8.0 mm.

Meanwhile, the folding part may be filled with a transparent resin material so that the cover window is bonded to a total surface of a display panel without an empty space therebetween. Furthermore, the folding part may be filled with the transparent resin material, and a total surface of the cover window may be continuously coated with the transparent resin material toward an upper side of the folding part. Additionally, the transparent resin material may be an optical clear resin (OCR).

In addition, when the folding part is formed on the opposite surfaces of the cover window, the transparent resin material, with which the folding part of the back surface of the cover window is filled, may be provided as a material softer than the transparent resin material, with which the folding part of a front surface thereof is filled.

Additionally, a functional coating layer may be formed in a single layer or multiple layers on the surface or opposite surfaces of the cover window.

In addition, a functional coating layer formed on the front surface of the cover window may be embodied as a strength reinforcement layer, and a functional coating layer formed on the back surface of the cover window may be embodied as an elastic reinforcement layer.

Furthermore, when the functional coating layer provided on the front surface of the cover window is provided in multiple layers, the functional coating layer may be formed of a material getting harder upward. Additionally, a functional coating layer formed on an uppermost layer may be given an anti-finger (AF) or an anti-reflective (AR) function.

In addition, a bonding film may be provided on the surface or opposite surfaces of the cover window, and the bonding film may be an anti-splinter film (ASF).

According to the present invention, the flexible cover window as a glass-based cover window includes the folding part slimmed by corresponding to the folding area of the display, and the boundary part having the inclination of 1 to 10°, thereby deteriorating the visibility of the reflective surface of the boundary part, so that the distortion of a screen or the visibility of the boundary part is minimized.

In addition, the thickness $t_2$ of the cover window is 50~300 μm and the thickness $t_1$ of the folding part is 20 to 100 μm, thereby having excellent strength and folding properties while maintaining the intrinsic texture of glass.

That is, the flexible cover window has high transmittance due to optical properties unique to glass, and can resist scratches and absorb external impact due to the securing of mechanical strength, so that a display panel has excellent visibility and impact resistance.

In addition, the folding part of the flexible cover window according to the present invention is filled with the transparent resin material to have no gap between the folding part and the total surface of the display. Accordingly, the distortion of display image quality can be minimized, and the decrease of touch response speed and the decrease of bonding strength between the display and the cover window can be solved.

Furthermore, the flexible cover window of the present invention has the folding part having uniform thickness and has the portion of the minimum thickness formed widely therein so that folding properties such as flexibility, resilience, and elasticity can be further improved, and the assembly tolerances between the cover window and the display panel can be minimized, thereby minimizing quality differences between products.

Additionally, the flexible cover window of the present invention has improved strength and folding properties while being thin and can be used to protect a clear polyimide (CPI) by being disposed thereon.

BRIEF DESCRIPTION OF THE DRAWINGS

The above and other objects, features, and other advantages of the present invention will be more clearly understood from the following detailed description when taken in conjunction with the accompanying drawings, in which.

DETAILED DESCRIPTION OF THE INVENTION

The present invention generally relates to a glass-based cover window. More particularly, the present invention relates to a flexible cover window, in which the visibility of a boundary part between a folding part and a plane area is minimized, and strength and folding properties are secured while the intrinsic texture of tempered glass is maintained.

Figure 3:
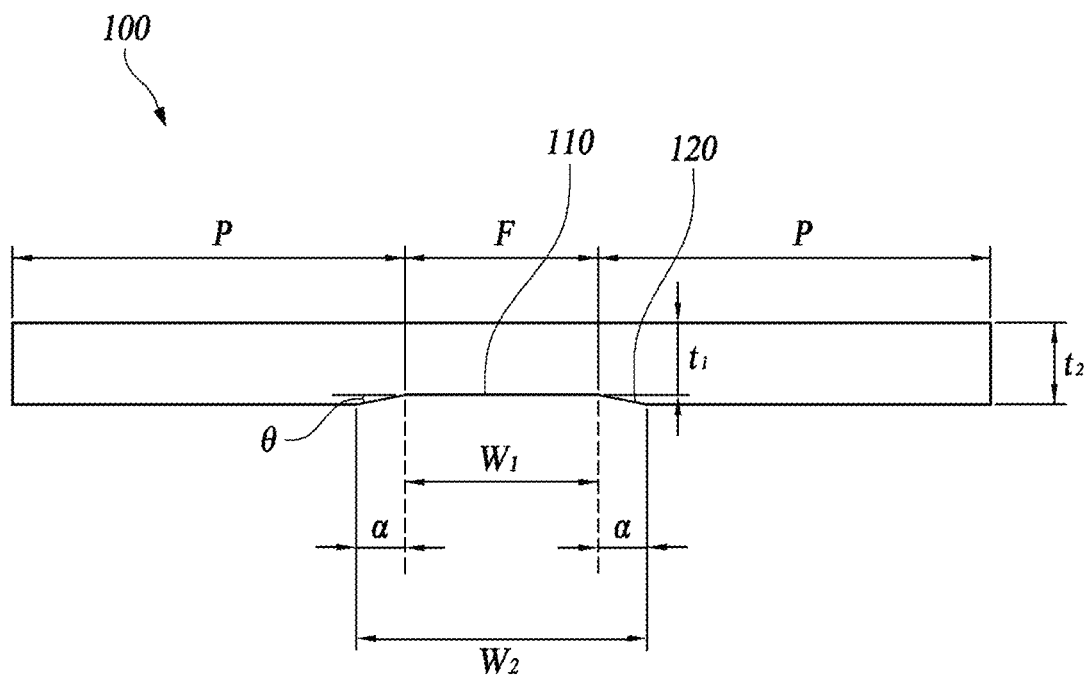
FIG. 3 is a side view of a flexible cover window according to an embodiment of the present invention.
Figure 4:
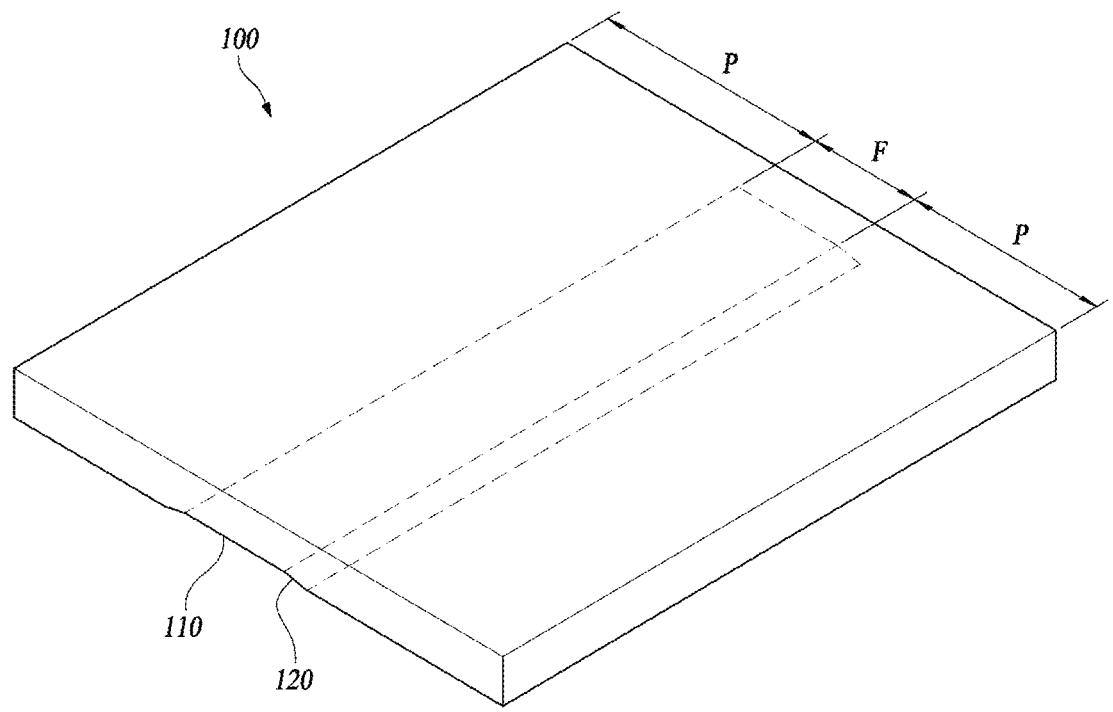
FIG. 4 is a perspective view of the flexible cover window according to the embodiment of the present invention.
Figure 5A:
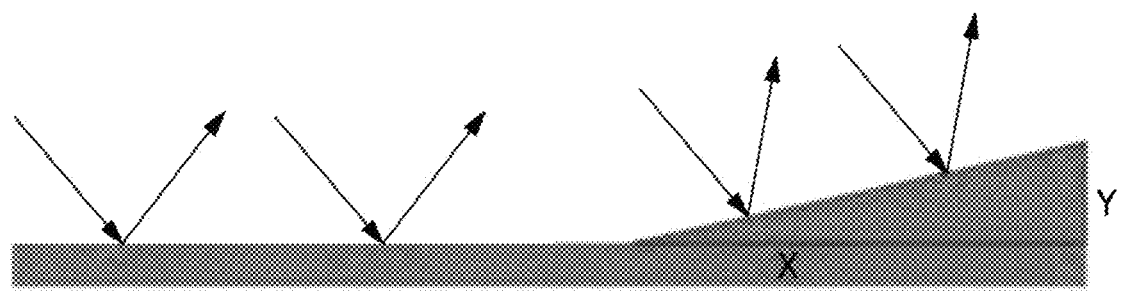
FIGS. 5A and 5B are a view illustrating a reflection angle of the boundary part of the existing flexible cover window and a view illustrating a reflection angle of a boundary part according to the present invention, respectively.
Figures 5B, 6:
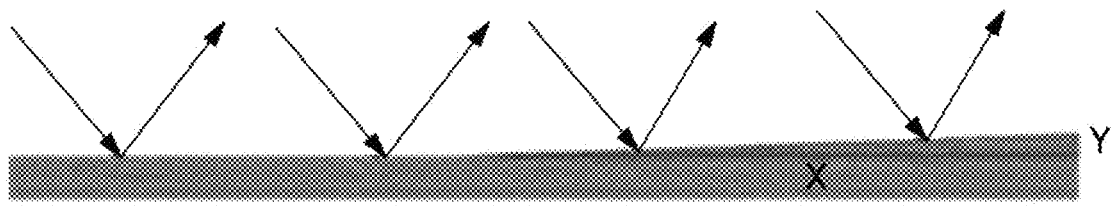
FIG. 6 is a table showing various examples of an etching width (x) and an etching depth (y) according to the inclination of the boundary part.
Figure 7:
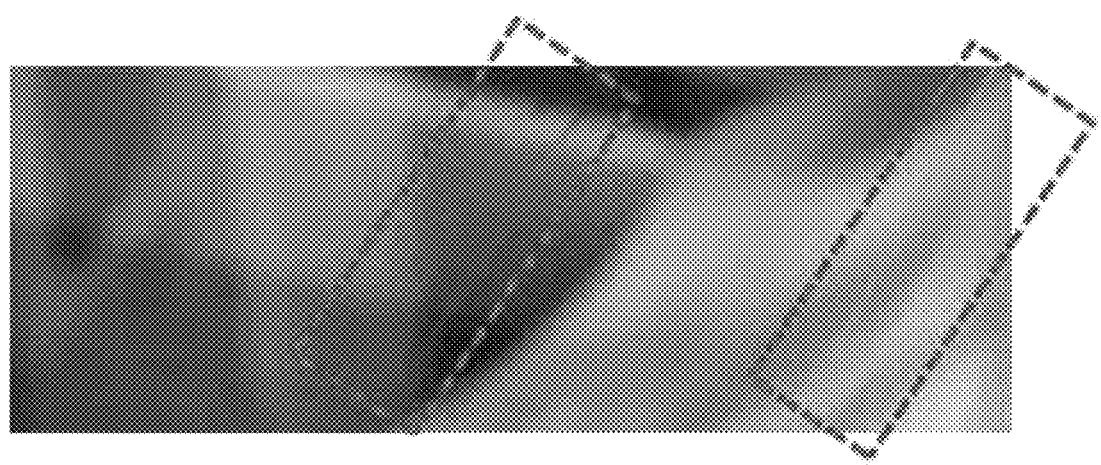
FIG. 7 is a view illustrating a state visible to naked eye in the boundary part of the folding part according to the embodiment of the present invention.

Hereinbelow, embodiments of the present invention will be described with reference to the accompanying drawings. FIG. 3 is a side view of the flexible cover window according to an embodiment of the present invention; FIG. 4 is a perspective view of the flexible cover window according to the embodiment of the present invention; FIGS. 5A and 5B are a view illustrating a reflection angle of a boundary part of the existing flexible cover window and a view illustrating a reflection angle of the boundary part according to the present invention, respectively; FIG. 6 is a table showing various examples of an etching width (x) and an etching depth (y) according to the inclination of the boundary part; FIG. 7 is a view illustrating a state visible to naked eye in the boundary part of the folding part according to the embodiment of the present invention; and FIGS. 8 to 15 are views illustrating various embodiments of the flexible cover window according to the present invention.

As illustrated in FIGS. 3 and 4, the flexible cover window 100 according to the present invention is a glass-based cover window for a flexible display, and includes the folding part 110 slimmed by corresponding to a folding area of the display, and the boundary part 120 provided on opposite ends of the folding part 110, the boundary part having a thickness gradually becoming larger from the folding part 110 and continuing to the plane area P of the cover window 100, wherein the inclination of the boundary part 120 is 1 to 10° relative to the folding part 110.

The boundary part 120 is formed between the folding part 110 and the plane area P, and is configured in an inclining shape to have the thickness gradually becoming larger from the folding part to the plane area. In the present invention, the boundary part 120 is configured to have the inclination of 1 to 10° relative to the folding part 110.

That is, the boundary part 120 is formed between the folding part 110 and the plane area P of the cover window 100, and is configured in the inclining shape of gently continuing from the folding part 110 to the plane area P.

The inclination of the boundary part 120 is preferably determined according to thickness $t_1$ of the folding part 110 and the width α of the boundary part 120. That is, to obtain the width and thickness of the folding part 110, which are designed, the width of the boundary part 120 is determined. Accordingly, the inclination of the boundary part 120 is set.

FIGS. 5A and 5B are the view illustrating the reflection angle of the boundary part of the existing flexible cover window and the view illustrating the reflection angle of the boundary part according to the present invention, respectively, and as the inclination of the boundary part is low, the size of the reflection angle of a reflective surface is similar in an entire area of the folding part 110 and the boundary part to minimize the interference of light and the visibility of the reflective surface.

FIG. 6 is the table showing the various examples of the etching width (x) and the etching depth (y) according to the inclination of the boundary part, and shows that the visibility of the reflective surface of the boundary part 120 having the inclination of 1 to 10°, more preferably, the inclination of 5° or less can be minimized. Accordingly, a slimming process is performed by reflecting the position of masking in terms of the ratio of the etching depth and the length of an x-axis.

Figure 1:
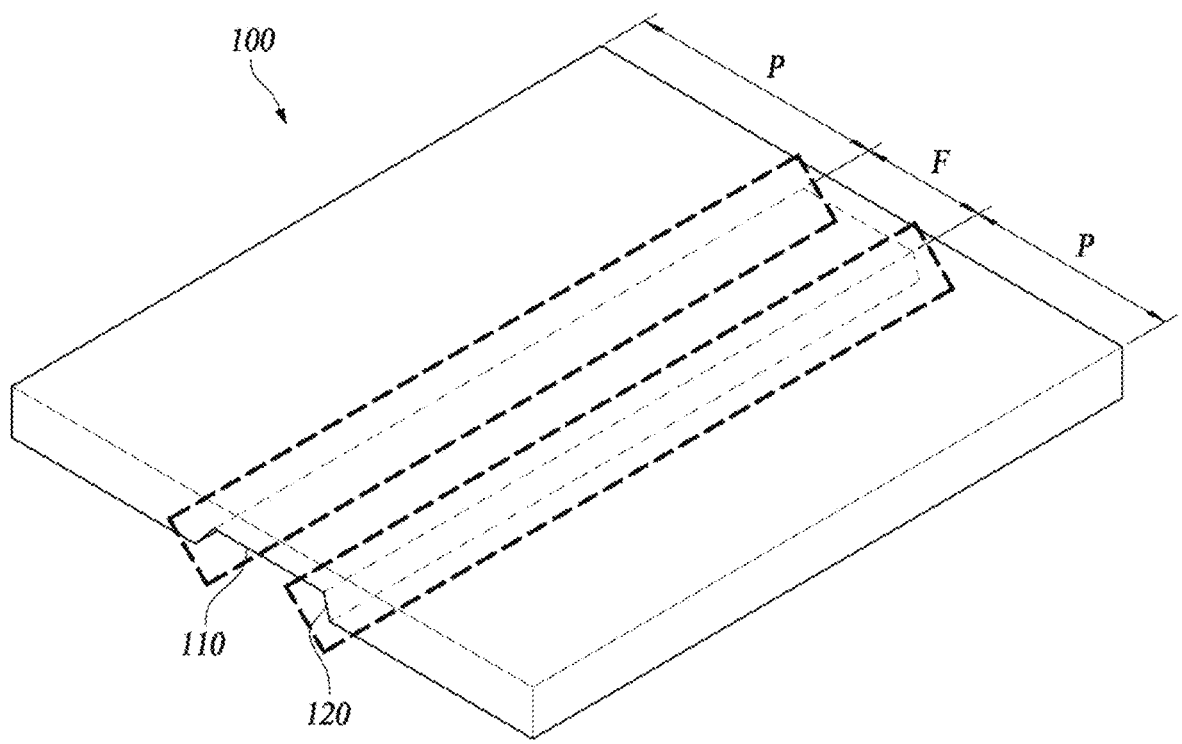
FIG. 1 is a view illustrating an existing flexible cover window.
Figure 2:
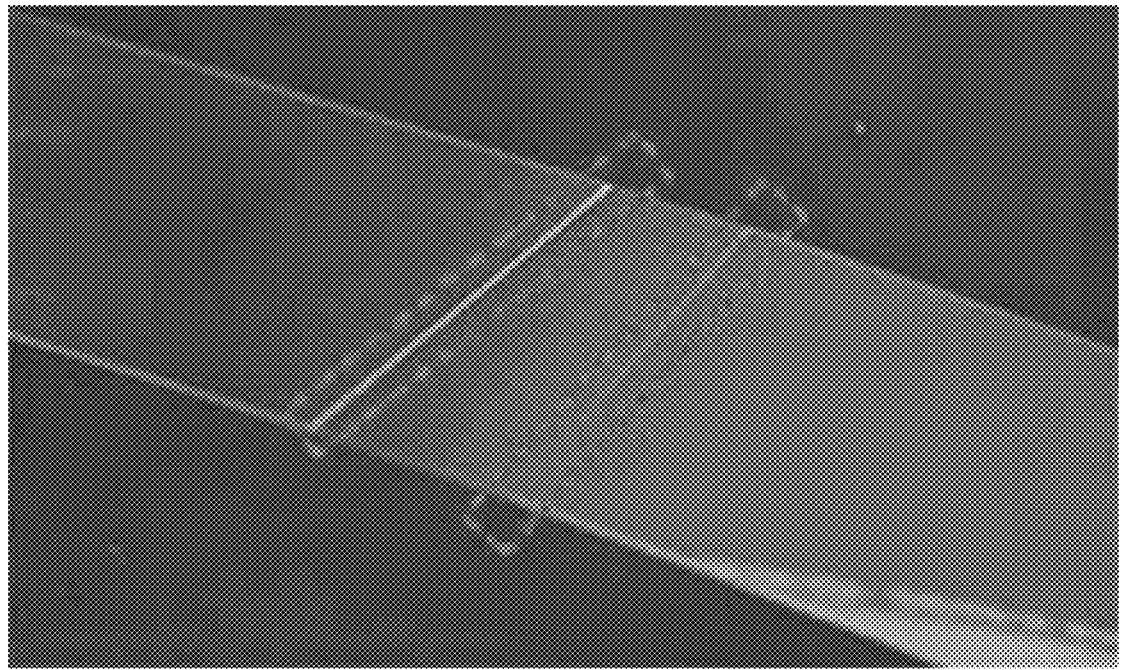
FIG. 2 is a view illustrating the visibility of a boundary part between a folding part and a plane area of the existing flexible cover window.

Accordingly, the problem that the boundary part positioned between the folding part 110 and the plane area P of the existing flexible cover window illustrated in FIGS. 1 and 2 is visible to naked eye due to the reflection of incident light can be solved by minimizing the inclination of the boundary part.

As illustrated in FIG. 7, unlike the boundary part visible to naked eye in the existing flexible cover window 100 including the boundary part 120 having a step, the flexible cover window 100 according to the present invention includes the boundary part 120 having inclination, in which the visibility of the reflective surface to naked eye is deteriorated, thereby minimizing the distortion of a screen or the visibility of the boundary part 120.

The forming of the folding part 110 may be performed by any one process of wet etching, polishing, laser forming, and masking processes, or by a process of combining at least two processes thereof, or by the wet etching, the laser forming, or the masking process, which is followed by the polishing process.

Meanwhile, according to the present invention, a thickness $t_2$ of the cover window 100 is 50~300 μm and a thickness $t_1$ of the folding part 110 is 20 to 100 μm.

Here, the folding area of the display refers to an area in which the display is folded or bent in half; an area in which the cover window 100 is folded by corresponding to the area is referred to as "a folding area" F of the cover window 100 in the present invention; and an area except for the folding area F, for convenience, is referred to as the "a plane area" P of the cover window 100.

In addition, in the cover window of the present invention, "a front surface" refers to a surface which a user sees or touches, and "a back surface" refers to a surface opposite thereto. Furthermore, "a total surface" refers to a surface of an entire area, and in the present invention, "a total surface of a display panel" usually refers to a surface of an entire area of the front surface of the display panel.

Accordingly, the present invention provides the cover window which is provided on the total surface of the display panel to maintain the folding properties while protecting the display panel. Furthermore, the cover window according to the present invention can be used to protect a clear polyimide (CPI) cover by being disposed on the CPI cover.

As illustrated in FIGS. 3 and 4, the cover window according to the present invention 100 is made of glass, and includes the folding part 110 formed to be thinner than other areas by being slimmed by corresponding to the folding area of the display. That is, the folding part 110, which is slimmed, is formed in the folding area F of the cover window 100.

Here, the folding part 110 is formed in the shape of a straight line such that the thickness of the folding area F of the cover window 100 is uniform, that is, the thickness thereof does not change.

This further improves the folding properties compared to a conventional technology in which a conventional folding part is formed in a curved shape. When the folding part 110 has the curved shape, the range of minimum thickness is relatively small. Accordingly, when folding is repeated, the folding properties deteriorates, so breaking occurs at a thick portion during folding. However, when the folding part 110 is formed to be uniform in entire thickness, that is, is formed in the shape of a straight line to have the same thickness as in the present invention, an area having the minimum thickness is widely formed so as to improve flexibility, resilience, and elasticity, so that the folding properties are improved.

In addition, when the conventional curved folding part is assembled mechanically, it is not easy to align the center thereof. However, the folding part 110 according to the present invention is formed to have the uniform thickness. Accordingly, when the folding part 110 is assembled mechanically, that is, when the cover window 100 is bonded to the total surface of the display panel, assembly tolerances can be reduced, so quality difference between products can be minimized and defect rates can be reduced.

Here, as described above, slimming of the folding part 110 is preferably performed by any one process of wet etching, polishing, laser forming, and masking processes, the masking process using a masking ink or a dry film photo resist (DFR), or by a process of combining at least two processes thereof, or by the wet etching, the laser forming, or the masking process, which is followed by the polishing process.

Here, a width $W_1$ of the folding part 110 is designed in consideration of a curvature radius of the cover window 100 when the cover window 100 is folded, and is roughly set as the curvature radius $R \times \pi$, and the thickness $t_1$ of a cover window 100 positioned in the folding part 110 is formed to be 20 to 100 μm. The thickness $t_1$ is set by a depth of the folding part 110.

When the depth of the folding part 110 is excessively deep, that is, when the folding area F of the cover window 100 is excessively thin, folding properties thereof are good, but wrinkles occur when the cover window 100 is tempered, or strength is decreased in the folding area F. However, when the folding area F of the cover window 100 is excessively thick, the flexibility, resilience, and elasticity of the folding area F are decreased and thus the folding properties are deteriorated. Accordingly, the thickness of the cover window 100 positioned in the folding part 110 is preferably 20 to 100 μm.

The cover window 100 of the present invention, which is based on glass, is formed to have the thickness $t_2$ of about 50~300 μm, and is used after chemical tempering treatment. In the thickness, the width and the depth of the folding part 110 as described above are properly designed. When the thickness of the cover window 100 is smaller than the thickness described above, the thickness of the folding area F of the cover window 100 is excessively thin after the forming of the folding part 110, so the above-described problems occur. However, when the thickness of the cover window 100 is larger than the thickness described above, flexibility, resilience, and elasticity thereof are decreased since the cover window 100 is based on glass as described above, and it is difficult to lighten display products.

The folding part 110 is formed in the shape of being slimmed inward from the folding area F of the cover window 100 and has the shape of a rectangular trench as a whole. The boundary part 120 is provided on opposite ends of the folding part 110, the boundary part 120 having thickness gradually becoming larger from the folding part 110 and continuing to the plane area P of the cover window 100. The inclination θ of the boundary part 120 is preferably 1 to 10° relative to the folding part 110, and more preferably, is in the range of 1 to 5°.

That is, the folding part 110 is preferably formed in a trapezoidal shape, not a rectangular shape. This is to gradually buffer stress occurring due to thickness difference between the folding area F and the plane area P of the cover window 100 when folding is repeated. In consideration of this, the inclination of the boundary part 120 is set.

In addition, the inclination of the boundary part 120 is configured to have the low inclination of 1 to 10°. Accordingly, the problem that the boundary part 120 between the folding part 110 and the plane area P in the prior art is visible to naked eye due to the reflection of incident light is solved.

Here, the width α of the boundary part 120 is represented by $\{(t_2-t_1)/2\}/\tan\theta$, and the entire width $W_2$ of the folding part 110 and the boundary part 120 is produced by summing the width $W_1$ of the folding part 110 and the width 2α of the boundary part 120 at each of opposite sides. This is summarized in the following equation.

$$W_1 = R \times \pi$$

$$W_2 = W_1 + 2\alpha$$

$$\alpha = \{(t_2-t_1)/2\}/\tan\theta$$

$$\theta = 1 \sim 50°$$

Here, $W_1$ refers to the width of the folding part 110, R refers to a minimum curvature radius of the cover window 100 when the cover window 100 is folded, $W_2$ refers to a value produced by summing the width of each of the folding part 110 and the boundary part 120, α refers to the width of the boundary part 120, and θ refers to the inclination of the boundary part 120.

Accordingly, the cover window 100 of the present invention based on glass is formed to have the thickness $t_2$ of about 50~300 μm, and is used after the chemical tempering treatment. In the thickness, the thickness $t_1$ of the cover window 100 positioned in the folding part 110 is formed to be 20 to 100 μm, and the inclination θ of the boundary part 120 is 1 to 10° (preferably, 1 to 5°) relative to the folding part 110, and the width $W_1$ of the folding part 110 is 3.0 to 8.0 mm. This is an optimal design for securing the thickness of the glass such that the intrinsic texture of the tempered glass is maintained and for securing the strength and the folding properties thereof at the same time.

Figure 8:
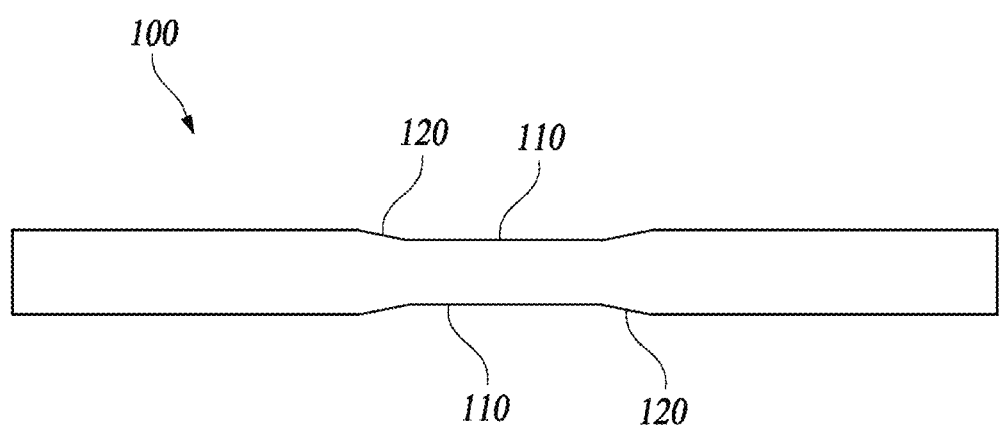
FIGS. 8 to 15 are views illustrating various embodiments of the flexible cover window according to the present invention.

Meanwhile, the folding part 110 may be formed on a surface of the cover window 100, and as illustrated in FIG. 8, the folding part 110 may be formed on opposite surfaces of the cover window 100. This is determined by choice according to display product specifications.

Particularly, when the folding part 110 is formed on the opposite surfaces of the cover window 100, the depths of the folding parts 110 may be configured to be the same or different. Preferably, the folding part 110 of the back surface of the cover window 100 may be configured to be deeper.

That is, the folding part 110 of the back surface is formed to be deeper than the folding part 110 of the front surface of the cover window 100 which a user touches, so the strength and the folding properties are secured and the feeling of physical touch and discomfort of the user are minimized.

Figure 9:
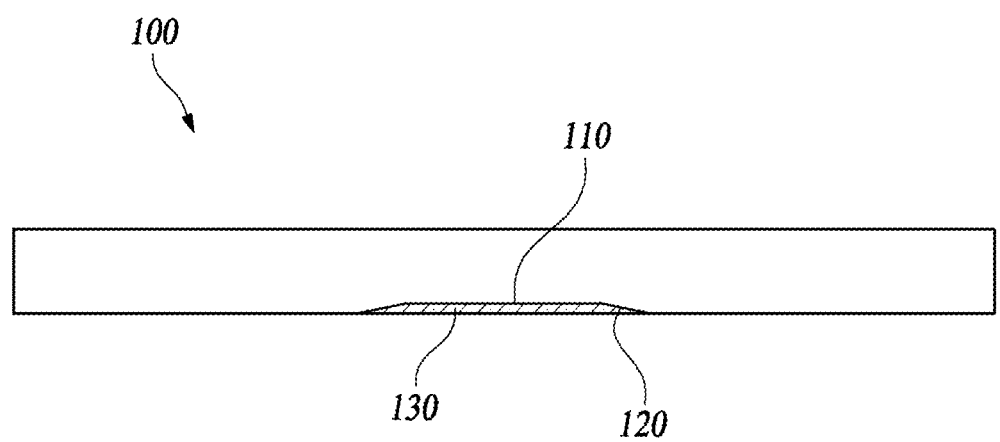

In addition, as illustrated in FIG. 9, the folding part 110 of the present invention is filled with a transparent resin material 130, so that the cover window is bonded to the total surface of the display panel without an empty space therebetween.

That is, the folding part 110 is filled with the transparent resin material 130 to provide the cover window 100 being uniform in entire thickness, so that there is no empty space (an air layer) when the cover window 100 is bonded to the total surface of the display panel.

As for the conventional cover window, there is a gap (an air layer) between the conventional cover window and the total surface of the display panel. Accordingly, the distortion of image quality due to difference in a refractive index between glass and the air layer, the decrease of touch response speed, and the decrease of bonding strength between the display panel and the cover window relative to the gap occur.

In the present invention, the folding part 110 is filled with the transparent resin material 130 having a refractive index almost identical to a refractive index (1.5) of glass, so all the above problems can be solved.

The transparent resin material 130 is an optical clear resin (OCR). For example, acrylic, epoxy, silicone, urethane, urethane compound, urethane acryl compound, hybrid sol gel, and siloxane family may be used. The combination of the resin materials is variously performed according to characteristics of the resin materials and can be used for reinforcing strength and elasticity.

Figure 10:
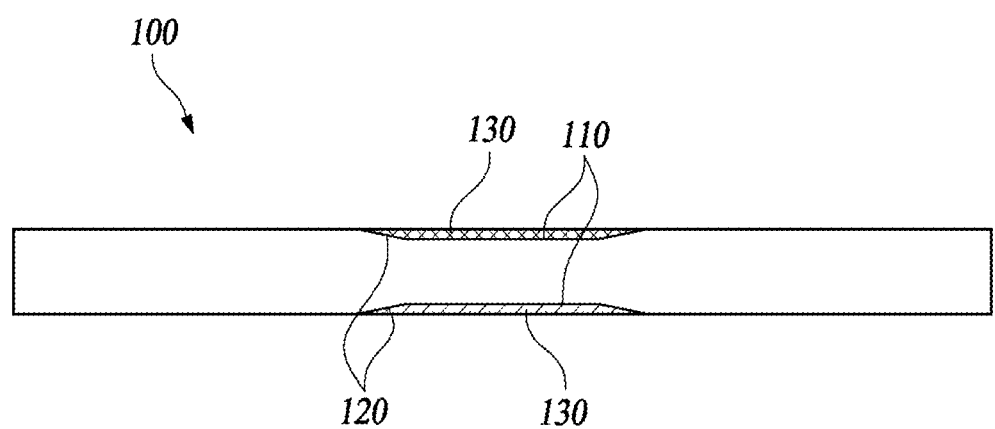

Furthermore, as illustrated in FIG. 10, when the folding part 110 is formed on the opposite surfaces of the cover window 100, the transparent resin material 130, with which the folding part 110 of the back surface (a stretching portion) of the cover window 100 is filled, is preferably provided as a material softer than the transparent resin material 130, with which the folding part 110 of a front surface (a folded portion) thereof is filled.

The folded portion is formed of a hard material by filling the portion which a user touches with the transparent resin material 130, which is a relatively hard material to maintain durability, and the stretching portion is formed of a relatively soft material to minimize cracks at the stretching portion.

Figure 11:
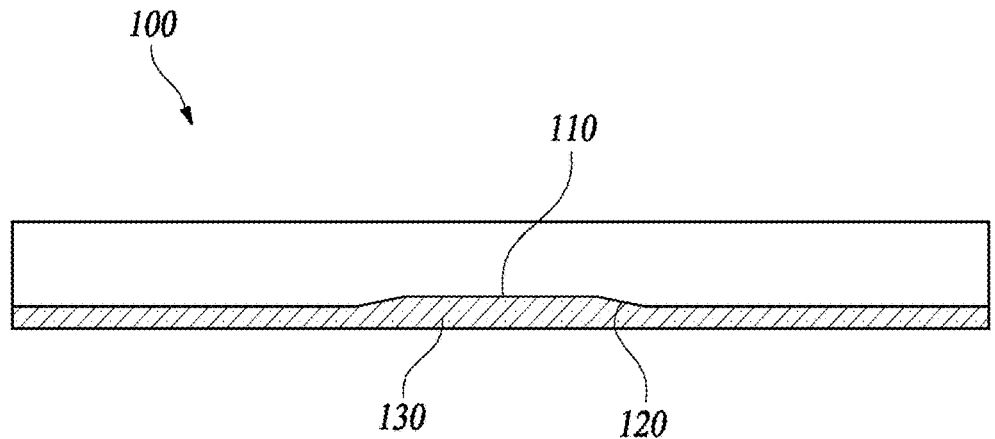
Figure 12:
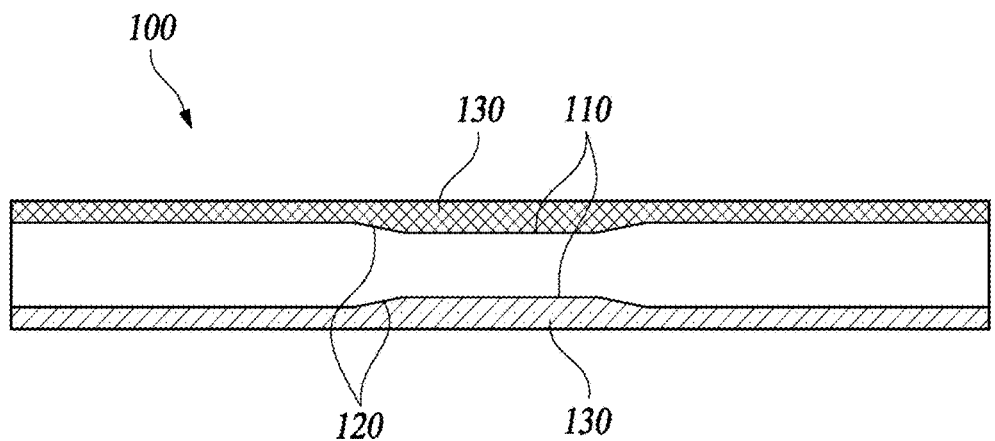

In addition, as illustrated in FIGS. 11 and 12, the folding part 110 is filled with the transparent resin material 130 and the total surface of the cover window 100 may be continuously coated with the transparent resin material 130 to an upper side of the folding part 110.

This is to prevent crack from occurring in the folding area, to minimize the visibility of the shape of the folding part 110 from the outside, and to secure flatness of a portion in contact with the display panel by allowing the folding part 110 to be filled with the transparent resin material 130. Furthermore, the cover window 100 has an elastic force reinforced on a surface in contact with the display panel, thereby having improved impact resistance and the function of preventing the splintering of glass when the glass is broken.

Figure 13:
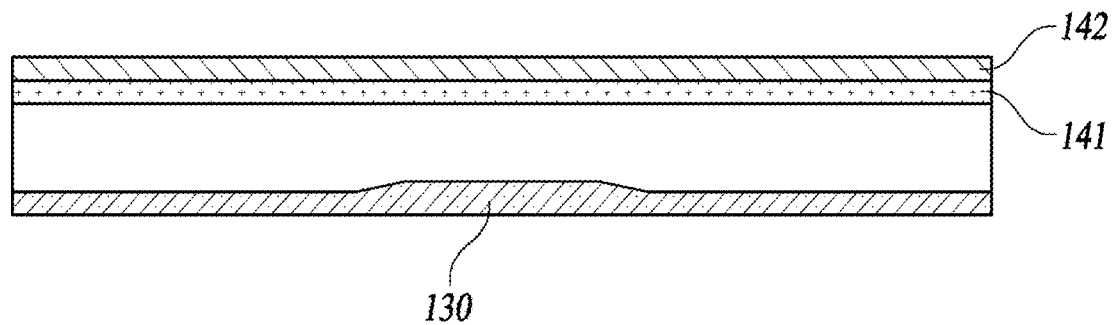
Figure 14:
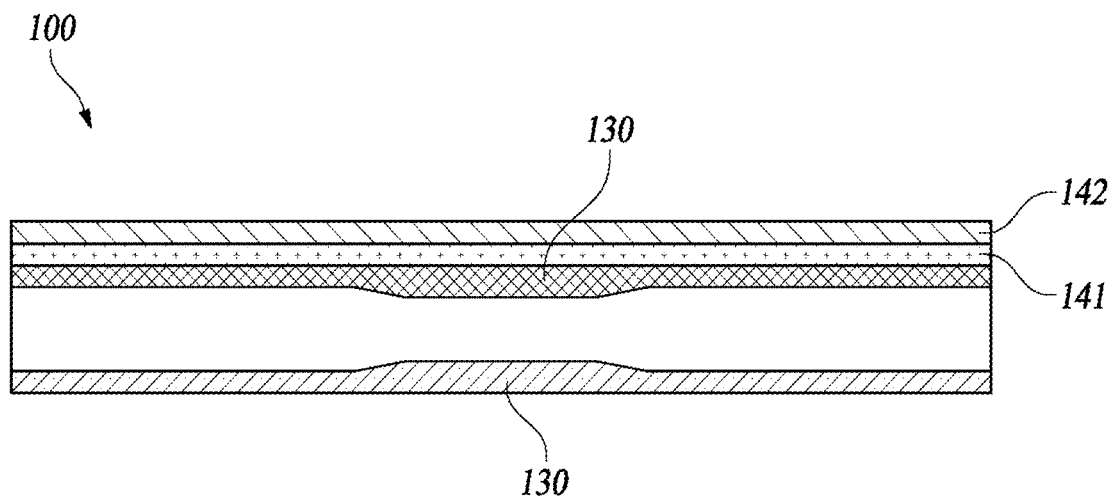

Meanwhile, as illustrated in FIGS. 13 and 14, a functional coating layer may further be provided on the surface or the opposite surfaces of the cover window 100. The functional coating layer is formed of a transparent material such as the transparent resin material 130 described above and has functionality by synthesizing a resin having a variety of properties.

When the folding part 110 is filled with the transparent resin material 130 or when the folding part 110 and the total surface of the cover window 100 are coated with the transparent resin material 130, the functional coating layer may be formed on an upper layer thereof. This can be formed by a known resin coating method such as spraying, dipping, and spin coating.

The functional coating layer can be formed in a single layer or multiple layers. The functional coating layer formed on the front surface of the cover window 100 may be embodied as a strength reinforcement layer, and the functional coating layer formed on the back surface of the cover window 100 may be embodied as an elastic reinforcement layer.

That is, since the front surface of the cover window 100 is touched, the functional coating layer having a reinforced strength may be embodied in the front surface. The functional coating layer having a reinforced elasticity may be embodied on the back surface of the cover window 100 to perform buffering between the back surface and the display panel.

The strength reinforcement layer (hard coating) of the front surface of the cover window 100 uses resin having relatively high hardness when the resin is hardened, for example, resin having a high content of resin such as acrylic or epoxy, and the elastic reinforcement layer (soft coating) of the back surface of the cover window 100 uses resin having relatively high elasticity when the resin is hardened, for example, resin having a high content of silicone or urethane synthetic resin. Furthermore, strength or elasticity is reinforced to be used by controlling the content of organic and inorganic materials in organic-inorganic hybrid sol-gel.

In addition, when the functional coating layer provided on the front surface of the cover window 100 is provided in multiple layers, the functional coating layer is preferably formed of a material getting harder upward.

FIGS. 13 and 14 illustrate a case in which the functional coating layer formed on the front surface of the cover window 100 is formed in two layers. The second functional coating layer 142 is formed of a material harder than a material of the first functional coating layer 141.

In addition, the functional coating layer, particularly, a functional coating layer formed on an uppermost layer may be given an anti-finger (AF) or an anti-reflective (AR) function, and may be embodied by synthesizing a resin having such a function or by forming various patterns, for example, patterns such as moth eyes on the functional coating layer.

Accordingly, since the cover window 100 according to the present invention fundamentally uses thin glass, the cover window 100 has the functional coating layer formed additionally thereon to reinforce strength and elasticity, so the cover window 100 can be protected from external impacts or the pressure of a touch pen.

In addition, the functional coating layer further prevents cracking in the folding area, and reinforces the elastic force of the cover window 100 on a surface in contact with the display panel, thereby functioning to improve impact resistance and prevent splintering.

Figure 15:
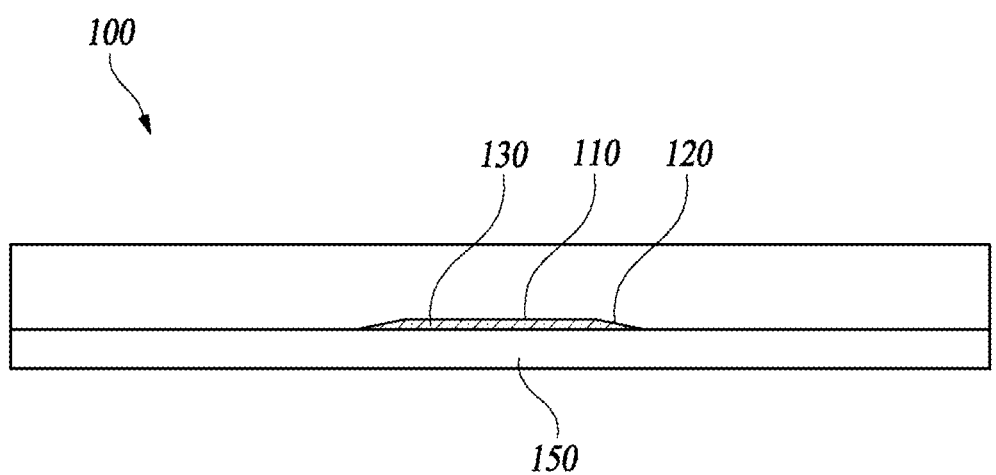

Meanwhile, according to the present invention, as illustrated in FIG. 15, a bonding film 150 is further provided on the surface or opposite surfaces of the cover window 100. The bonding film 150 and the cover window 100 are bonded to each other by an optical clear adhesive (OCA). The bonding film 150 may be provided on the front surface or the back surface of the cover window 100, and may be provided on the opposite surface thereof. The bonding film 150 may be provided on an upper layer of the functional coating layer, and may displace the functional coating layer.

The bonding film 150 is formed to have the thickness of 0.025 mm~0.150 mm, and can be used as an anti-splinter film (ASF) in the present invention.

The bonding film 150 is used to improve the physical properties of the cover window 100 so that flexibility and impact resistance are improved.

That is, the cover window 100 made of glass functions as shape maintenance due to the improvement of flexibility, resilience, elasticity, and mechanical strength, and the bonding film 150 functions to improve impact resistance due to elastic protection while compensating for bendability.

Such a bonding film 150 is any one of polycarbonate (PC), polyacrylate (PA), polyvinylalcohol (PVA), polyimide (PI), and polyethylene terephthalate (PET), which are transparent materials.

In addition, when the bonding film 150 is formed on the front surface of the cover window 100 as necessary, the bonding film may have functionality by receiving any one of AR treatment and AF treatment or combination thereof.

The following table 1 shows the curvature radius R of the cover window according to the present invention, that is, a curvature radius of the folding area when folding the cover window, and shows the folding properties best.

Table 1 shows curvature radius data according to the thickness based on 95% pass during folding test 200,000 times, and the cover window of the present invention is shown to have excellent folding properties.

TABLE 1

| Curvature radius R | Thickness $t_1$ of folding part |
|---|---|
| 0.8 mm | 20 μm |
| 1.3 mm | 30 μm |
| 1.7 mm | 40 μm |
| 1.9 mm | 45 μm |
| 2.1 mm | 50 μm |

As described above, the flexible cover window according to the present invention as a glass-based cover window includes the folding part slimmed by corresponding to the folding area of the display, and the boundary part having the low inclination, thereby deteriorating the visibility of the reflective surface of the boundary part, so that the distortion of a screen or the visibility of the boundary part is minimized.

Furthermore, the thickness $t_2$ of the cover window 100 is 50~300 μm and the thickness $t_1$ of the folding part 110 is 20 to 100 μm. The flexible cover window has excellent strength and folding properties while maintaining the intrinsic texture of glass.

In addition, the folding part of the flexible cover window according to the present invention is filled with the transparent resin material to have no gap between the folding part and the total surface of the display. Accordingly, the distortion of display image quality can be minimized, and the deterioration of touch response speed and the decrease of bonding strength between the display panel and the cover window can be solved.

Furthermore, the flexible cover window of the present invention has the folding part having uniform thickness and has the portion of the minimum thickness formed widely therein so that folding properties such as flexibility, resilience, and elasticity can be further improved, and the assembly tolerance between the cover window and the display panel can be minimized.

Additionally, the flexible cover window of the present invention has improved strength and folding properties while being thin and can be used to protect a clear polyimide (CPI) by being disposed thereon.

What is claimed is:

1. A flexible glass-based cover window for a flexible display, the cover window comprising:
    a plane area and a folding part having a thickness less than a thickness of the plane area, the folding part corresponds to a folding area of a display when used with the display and the plane area is configured to remain planar when used with the display, and
    a boundary part provided on opposite ends of the folding part, the boundary part having a thickness gradually becoming larger than a thickness of the folding part, the boundary part continuing to the plane area of the cover window, wherein the folding part is provided to be uniform in thickness in a folding area of the cover window, a width ($W_1$) of the folding part is 3.0 to 8.0 mm, and a thickness ($t_1$) of the folding part is 20 to 100 μm,
    a straight linear inclination of the boundary part is 1 to 10° relative to the folding part and the inclination of the boundary part is determined according to the thickness ($t_1$) of the folding part and a width ($\alpha$) of the boundary part,
    wherein the cover window satisfies a minimum curvature radius of 0.5 to 2.5 mm during folding,
    the folding part is in a back surface of the cover window and said back surface of the cover window is filled with a transparent resin material so that the cover window can be bonded to a total surface of a display panel without an empty space therebetween, and
    a front surface of the cover window is on a side of the cover window configured to be touched.

2. The flexible cover window of claim 1, wherein the folding part is provided on opposite surfaces of the cover window.

3. The flexible cover window of claim 2, wherein when the folding part is provided on the opposite surfaces of the cover window, depths of the folding parts are configured to be the same or different.

4. The flexible cover window of claim 1, wherein a thickness ($t_2$) of the cover window is 50~300 μm.

5. The flexible cover window of claim 1, wherein the folding part is formed in a process of wet etching, polishing, laser forming, and masking processes, or by a process of combining at least two processes thereof, or by the wet etching, the laser forming, or the masking process, which is followed by the polishing process.

6. The flexible cover window of claim 1, wherein a total surface of the cover window is continuously coated with the transparent resin material toward an upper side of the folding part.

* * * * *